United States Patent [19]

Tsujita

[11] Patent Number: 5,783,365
[45] Date of Patent: Jul. 21, 1998

[54] MANUFACTURING METHOD OF SEMICONDUCTOR DEVICE

[75] Inventor: Kouichirou Tsujita, Tokyo, Japan

[73] Assignee: Mitsubishi Denki Kabushiki Kaisha, Tokyo, Japan

[21] Appl. No.: 561,851

[22] Filed: Nov. 22, 1995

[30] Foreign Application Priority Data

Dec. 16, 1994 [JP] Japan .................... 6-313396

[51] Int. Cl.$^6$ .................... G03C 5/00
[52] U.S. Cl. .................... 430/311; 430/320; 430/325; 430/326; 430/327
[58] Field of Search .................... 430/311, 320, 430/325, 326, 327; 438/954

[56] References Cited

U.S. PATENT DOCUMENTS

| | | | |
|---|---|---|---|
| 4,335,505 | 6/1982 | Shibata et al. | 29/577 R |
| 5,229,254 | 7/1993 | Lohaus et al. | 430/281 |
| 5,314,782 | 5/1994 | Lazarus et al. | 430/165 |
| 5,413,953 | 5/1995 | Chien et al. | 437/69 |
| 5,418,019 | 5/1995 | Chen et al. | 427/579 |
| 5,600,165 | 2/1997 | Tsukamoto et al. | 257/323 |

OTHER PUBLICATIONS

The Japan Society of Applied Physics, vol. 41, No. 2, p. 566, 1994, T. Fukushima, et al., "A Study for Substrate Surface Effect of Chemically Amplified Resist". Eng. Abstract only.

The Japan Society of Applied Physics, vol. 53, No. 2, p. 505, 1992, E. Shiobara, et al., "Influence of Surface Contamination on Chemically Amplified Positive Resist". Eng Abstract only.

*Primary Examiner*—Janet C. Baxter
*Assistant Examiner*—Rosemary Ashton
*Attorney, Agent, or Firm*—Oblon, Spivak, McClelland, Maier & Neustadt, P.C.

[57] ABSTRACT

To present a manufacturing method of semiconductor device capable of preventing deactivation phenomenon of acid of chemically amplified resist when the foundation layer is a silicon nitride film, and obtaining a favorable resist shape, and enhanced in stability of resist patter. A silicon nitride film (3) is exposed to an oxygen atmosphere at 800° to 1200° C., and a thermal oxide film (4) in a thickness of about 40 to 50 angstroms (4 to 5 nm) is formed on the silicon nitride film (3), and then a resist layer (5) is formed. It hence eliminates the problems of instability of dimensions and shape of the silicon nitride film due to tail or under-cut formed in the sectional shape of the resist layer, and simultaneously solves the problem of instability of the resist pattern by peeling of the resist layer due to deterioration of adhesion between the resist layer and silicon nitride film.

6 Claims, 18 Drawing Sheets

MANUFACTURING METHOD OF SEMICONDUCTOR DEVICE

BACKGROUND OF THE INVENTION

1. Field of the Invention

The present invention relates to a manufacturing method of semiconductor device, and more particularly to a manufacturing method of semiconductor device comprising a step of patterning by using a chemically amplified resist.

2. Description of the Background Art

As the semiconductor device is being reduced in size, the KrF excimer laser (wavelength 248 nm) comes to be used as the exposure light source of photolithography for forming fine patterns. The conventional novolak resin resist shows a large absorption in the far UV region (wavelength 200 nm to 300 nm), and is not suited to patterning by using KrF excimer laser. Accordingly, as the resist for KrF excimer laser, a chemically amplified resist is used because it is high in transparency to far UV light and excellent in sensitivity so as to be capable of forming fine patterns.

The chemically amplified resist comprises an acid generator for generating acid or other reaction product by exposure, and a compound for changing the polarity (releasing the dissolution suppressive effect) or crosslinking in the reaction product by heat treatment after exposure.

By using the chemically amplified resist (positive type) containing a compound for generating an acid by exposure and changing the polarity in the reaction product by heat treatment after exposure, the polarity change occurs by the catalytic reaction of the generated acid, and the resist comes to have a dissolution to the developing solution, thereby executing patterning. On the other hand, by using the chemically amplified resist (negative type) containing a compound for crosslinking the reaction product by heat treatment after exposure, crosslinking occurs by the catalytic reaction of the generated acid, and the resist is solidified to the developing solution, thereby executing patterning.

When patterning by using such chemically amplified resist making use of catalytic reaction of acid (hereinafter called chemically amplified resist for short), the following problems may occur depending on the type of the foundation layer for applying the chemically amplified resist.

<When the foundation layer is an oxide film or TEOS film containing phosphorus or boron>

One is a case of applying a chemically amplified resist on a foundation layer which is either oxide film or TEOS (tetra ethyl ortho silicate) film containing phosphorus or boron. Herein, the TEOS film is an oxide film formed by using TEOS as material, and to form the TEOS film, the TEOS which is liquid at ordinary temperature is vaporized to be a source gas, which is introduced into the reaction oven together with carrier gas for conveying.

FIG. 16 shows a structural formula of source gas or TEOS, and FIG. 17 shows a structural formula after reaction. In FIG. 16, four ethoxyl groups ($C_2H_5O$—) are coupled to the central silicon (Si). As a result of reaction, as shown in FIG. 17, a pair of ethoxy groups are removed, and multiple compositions of coupling of silicon atoms are formed to compose a TEOS film. The actual TEOS film is not such a perfect one. FIG. 18 shows a structural formula of an actually formed TEOS film. In FIG. 18, part of ethoxy group is a hydroxyl group, which is likely to absorb water.

The oxide film containing phosphorus or boron is high in moisture absorbing property because of the nature of phosphorus and boron, and is likely to absorb water. Therefore, the oxide film and TEOS film containing phosphorus or boron contain much water.

Also the oxide film and TEOS film containing phosphorus or boron are often formed by CVD (chemical vapor deposition) method, and the surface of the oxide film and TEOS film formed by the CVD method is a rough surface with a severe unevenness. In this case, if the water contained inside is less, much water is accumulated on the surface.

Using such oxide film or TEOS film containing phosphorus or boron having much water on the surface and inside as the foundation layer, when patterning by applying a chemically amplified resist thereon, the acid generated by exposure and the water in the foundation layer cause a reaction ($H^+ + H_2O \rightarrow H_3O^+$), and the activity of pure proton is lowered, and the catalytic reaction of acid is lost (deactivated).

As a result, in the case of positive resist, the solubility of the exposure area is lowered, and the sectional shape of the resist has a tail. FIG. 19 is a sectional view of a resist having a tail. In the case of negative resist, on the other hand, the crosslinking property of the exposure area is lowered, and an under-cut occurs in the sectional shape of the resist. FIG. 20 is a sectional view of a resist having an under-cut. If the sectional shape of the resist has a tail or under-cut, the etching shape is not stable in the subsequent etching process, which may lead to defective pattern.

Moreover, in the case of negative resist, the contact portion of the foundation layer and resist is an area weak in the irradiation of exposure light as compared with the upper portion, and the crosslinking property is at its lowest. Therefore, the deterioration between the resist and foundation layer deteriorates.

Incidentally, the reaction of the chemically amplified resist is a very sensitive reaction, generating a trace of acid. Therefore, once the acid is deactivated, the reaction is not stable, and the pattern size is not stable in pattern formation.

Accordingly, in the case of using the oxide film or TEOS film containing phosphorus or boron as the foundation layer, it has been attempted, as disclosed in Japanese Laid-open Patent No. 4-28225 or 6-84774, to prevent deactivation phenomenon of acid by forming an intermediate layer of silicon oxide film or silicon nitride film not containing phosphorus or boron on the foundation layer by CVD method and applying a chemically amplified resist thereon.

<If silicon nitride layer is present as foundation layer>

In the case explained below, the foundation layer is a silicon nitride film, and a chemically amplified resist is applied thereon. FIG. 21 shows a chemical reaction of taking in proton by the silicon nitride film. In FIG. 21(a), coupling of silicon (Si) and nitrogen (N) is based on covalent bond, and an electron loan pair EP is present in the nitrogen. This loan pair is likely to be coupled with an acid, that is, proton ($H^+$), and is likely to take it in. Therefore, as shown in FIG. 21(b), in the structure, silicon nitride film takes in proton.

In such a case, too, the activity of pure proton is lowered, and the acid is deactivated, and it involved the same problems as in the case of using the oxide film or TEOS film containing phosphorus or boron as the foundation layer. However, no effective method has been known for preventing the deactivation phenomenon of acid of the chemically amplified resist that causes such problems.

Thus, if the foundation layer is a silicon nitride layer, any effective method for preventing deactivation phenomenon of acid of the chemically amplified resist is not known, but the sectional shape of the resist may have tail or under-cut, the adhesion of the resist and foundation layer deteriorates, and the pattern dimensions are unstable in pattern formation.

SUMMARY OF THE INVENTION

A first aspect of the present invention relates to a manufacturing method of semiconductor device for patterning by using a chemically amplified resist in which a reaction is promoted by acid serving as a catalyst, comprising the steps of (a) forming a thermally oxidizable foundation layer containing at least silicon as constituent element, (b) forming a thermal oxide film on a surface of said foundation layer by thermally oxidizing the foundation layer, and (c) after applying a chemically amplified resist on the thermal oxide film, forming a resist layer having a predetermined pattern by exposing said chemically amplified resist.

A second aspect of the present invention relates to a manufacturing method of semiconductor device, wherein the step (a) comprises the step of forming a silicon nitride film as the foundation layer.

A third aspect of the present invention relates to a manufacturing method of semiconductor device, wherein the step (a) comprises the step of (d) forming a silicon nitride film by thermal chemical vapor deposition method, and the step (b) comprises the step of (e) thermally oxidizing a surface of the silicon nitride film by exposing the silicon nitride film to an oxygen atmosphere at 800° to 1200° C.

A fourth aspect of the present invention relates to a manufacturing method of semiconductor device, wherein the step (e) comprises the step of forming a thermal oxide film in a thickness of 40 to 50 angstroms, said method further comprising the step of (f) removing simultaneously the thermal oxide film and the silicon nitride film, by using the resist layer as mask, after said step (c).

A fifth aspect of the present invention relates to a manufacturing method of semiconductor device, wherein the step (a) comprises the step of (d) forming a plasma silicon nitride film containing more silicon than stoichiometric silicon nitride (Si3N4) by plasma chemical vapor deposition method, as the foundation layer, and the step (b) comprises the step of (e) thermally oxidizing a surface of the silicon nitride film by exposing the silicon nitride film to oxygen plasma.

A sixth aspect of the present invention relates to a manufacturing method of semiconductor device, wherein the step (e) comprises the step of forming a thermal oxide film in a thickness of 40 to 50 angstroms, said method further comprising the step of (f) removing simultaneously the thermal oxide film and the plasma silicon nitride film, by using the resist as mask, after said step (c).

A seventh aspect of the present invention relates to a manufacturing method of semiconductor device, wherein the step (d) comprises the step of forming a plasma silicon nitride film of which real part of complex refractive index to the wavelength of exposure light is above 1.8 under 3.4, and imaginary part is above 0.5 under 2.0, by controlling a supply flow rate of material gas of ammonia below the supply flow rate of material gas of monosilane, in a mixed atmosphere of material gas of monosilane, material gas of ammonia, and material gas of nitrogen.

According to the manufacturing method of semiconductor device of the first aspect of the present invention, by forming a thermal oxide film on the surface of a thermally oxidizable foundation layer containing at least silicon as constituent element, hydrogen ions of the chemically amplified resist promoted in reaction by an acid serving as a catalyst are prevented from being taken into the foundation layer, and hence deactivation phenomenon of acid of the chemically amplified resist is avoided. Besides, since the thermal oxide film has a dense structure, its surface is smooth and does not hold water, and therefore the acid of the chemically amplified resist is prevented from being deactivated by the held water.

Therefore, it is free from the problems of instability of the dimensions and shape of the resist pattern due to tail or under-cut of the sectional shape of the resist layer, and at the same time it eliminates the problem of instability of resist pattern by peeling of the resist layer due to deterioration of adhesion between the resist layer and silicon nitride film.

According to the manufacturing method of semiconductor device of the second aspect of the present invention, when it is necessary to form a silicon nitride film as foundation layer, hydrogen ions of the chemically amplified resist promoted in reaction using acid as catalyst are prevented from being coupled with the electron loan pair possessed by the nitrogen of the silicon nitride film, so that the deactivation phenomenon of acid of the chemically amplified resist may be avoided.

Therefore, it is free from the problems of instability of the dimensions and shape of the resist pattern due to tail or under-cut of the sectional shape of the resist layer, thereby obtaining a field oxide film stable in dimensions and shape.

According to the manufacturing method of semiconductor device of the third aspect of the present invention, when the silicon nitride film is formed by thermal chemical vapor deposition method, the silicon nitride film has a high heat resistance, and therefore the thermal oxide film can be formed by exposing the silicon nitride film to an oxygen atmosphere at 800° to 1200° C.

Therefore, the technique of thermal oxidation which is technically established, and is relatively simple in process and apparatus can be employed, and increase of manufacturing cost by formation of thermal oxide film can be suppressed.

According to the manufacturing method of semiconductor device of the fourth aspect of the present invention, the thickness of the thermal oxide film is 40 to 50 angstroms, and a predetermined pattern is formed by removing the thermal oxide film and silicon nitride film simultaneously, using the resist layer as mask, so that the manufacturing process can be simplified.

Therefore, increase of manufacturing cost by formation of thermal oxide film can be suppressed.

According to the manufacturing method of semiconductor device of the fifth aspect of the present invention, when it is necessary to form the silicon nitride film by a plasma silicon nitride film containing more silicon than stoichiometric silicon nitride ($Si_3N_4$) by plasma chemical vapor deposition method, the thermal oxide film is formed by exposing the plasma silicon nitride film to an oxygen plasma, and therefore the plasma silicon nitride film and thermal oxide film cam be formed by using the same apparatus.

Therefore, not requiring the step of transferring the sample, increase of manufacturing time by formation of thermal oxide film can be suppressed.

According to the manufacturing method of semiconductor device of the sixth aspect of the present invention, the thickness of the thermal oxide film is 40 to 50 angstroms, and a predetermined pattern is formed by removing the thermal oxide film and plasma silicon nitride film simultaneously, using the resist layer as mask, so that the manufacturing process can be simplified.

Therefore, increase of manufacturing cost by formation of thermal oxide film can be suppressed.

According to the manufacturing method of semiconductor device of the seventh aspect of the present invention, the plasma silicon nitride film is formed so that the real part of the complex refractive index to the wavelength of the exposure light is above 1.8 under 3.4, and the imaginary part is above 0.5 under 2.0, and therefore the plasma silicon nitride film has a reflection preventive function to the exposure light.

Therefore, it is free from the problems of instability of the dimensions and shape of the resist pattern due to tail or under-cut of the sectional shape of the resist layer.

It is therefore an object of the present invention to solve the problems and provide a manufacturing method of semiconductor device enhanced in the stability of resist pattern, by preventing deactivation phenomenon of acid of the chemically amplified resist, when the foundation layer is a silicon nitride film, thereby obtaining a favorable resist shape, and preventing lowering of adhesion between the resist and foundation layer.

These and other objects, features, aspects and advantages of the present invention will become more apparent from the following description of the present invention when taken in conjunction with the accompanying drawings.

DESCRIPTION OF THE PREFERRED EMBODIMENTS

Explained below are examples of applying the manufacturing method of semiconductor device according to the present invention in the case of applying a chemically amplified resist on a silicon nitride film.

<First preferred embodiment>

<If there is a silicon nitride film for forming a field oxide film>

As a first preferred embodiment of a manufacturing method of semiconductor device of the invention, a case of forming a field oxide film on a silicon substrate is explained. FIG. 1 to FIG. 5 are sectional views showing the manufacturing process of field oxide film sequentially.

Figure 1:
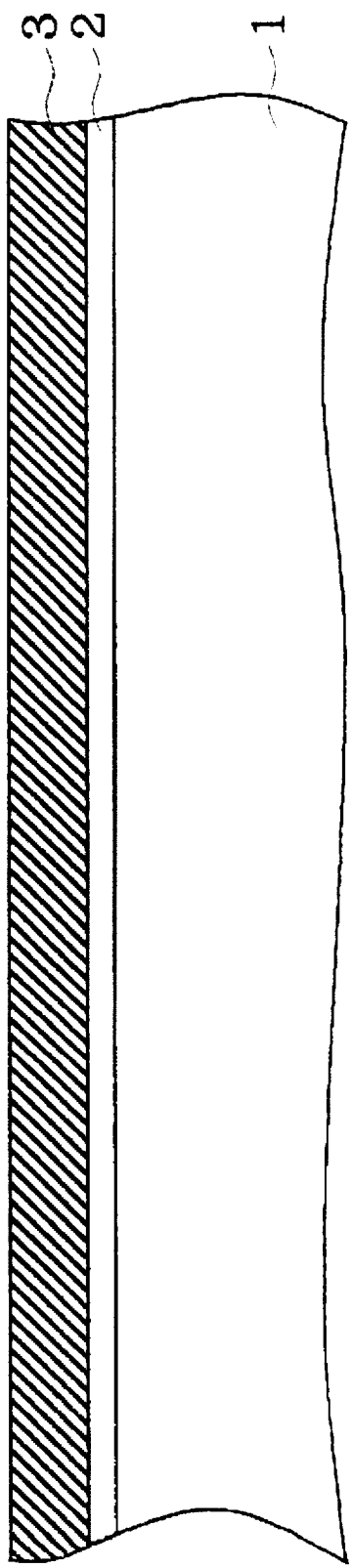
FIG. 1 is a sectional view explaining a first preferred embodiment of a manufacturing method of semiconductor device according to the present invention.

At a step shown in FIG. 1, an oxide film 2 made of $SiO_2$ is formed on a principal surface of a silicon substrate 1 by CVD method. In succession, a stoichiometric silicon nitride film ($Si_3N_4$) 3 is formed on the oxide film 2 by thermal CVD method. The thermal CVD method is a kind of CVD method for exciting the material gas of silicon nitride film by using thermal energy by heating.

Figure 2:
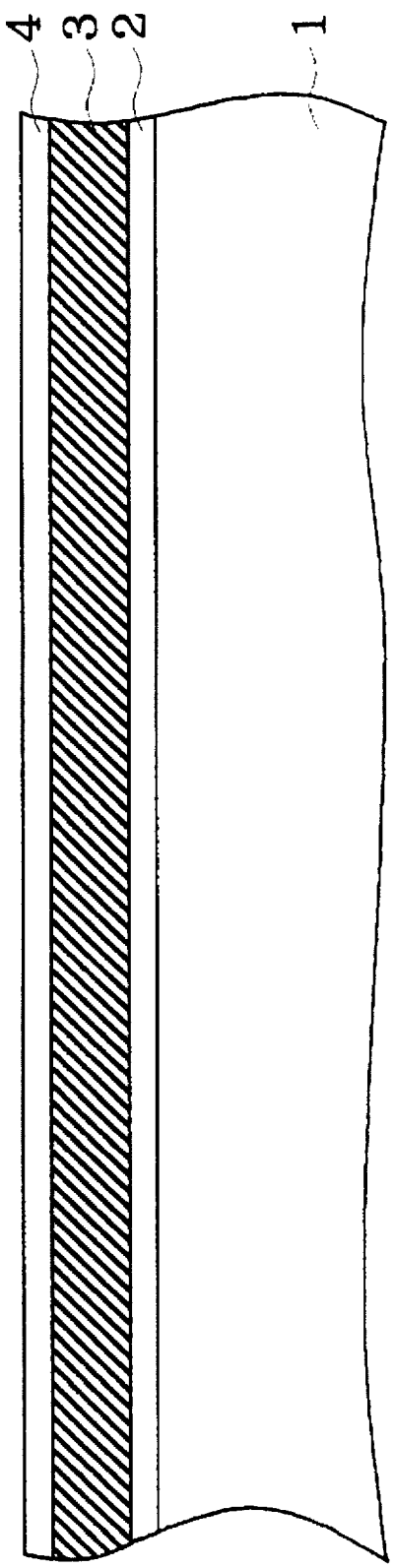
FIG. 2 is a sectional view explaining the first preferred embodiment of a manufacturing method of semiconductor device according to the present invention.

At a next step in FIG. 2, the silicon nitride film is exposed to an oxygen atmosphere at 800° to 1200° C., and a thermal oxide film 4 is formed on the silicon nitride film 3 in a thickness of about 40 to 50 angstroms (4 to 5 nm). In this case, the silicon nitride film 3 formed through the above process has a high heat resistance, and thermal oxidation can be performed by exposing to an oxygen atmosphere at 800° to 1200° C. The technique of thermal oxidation is established technically, and the process and apparatus are relatively simple.

Figure 3:
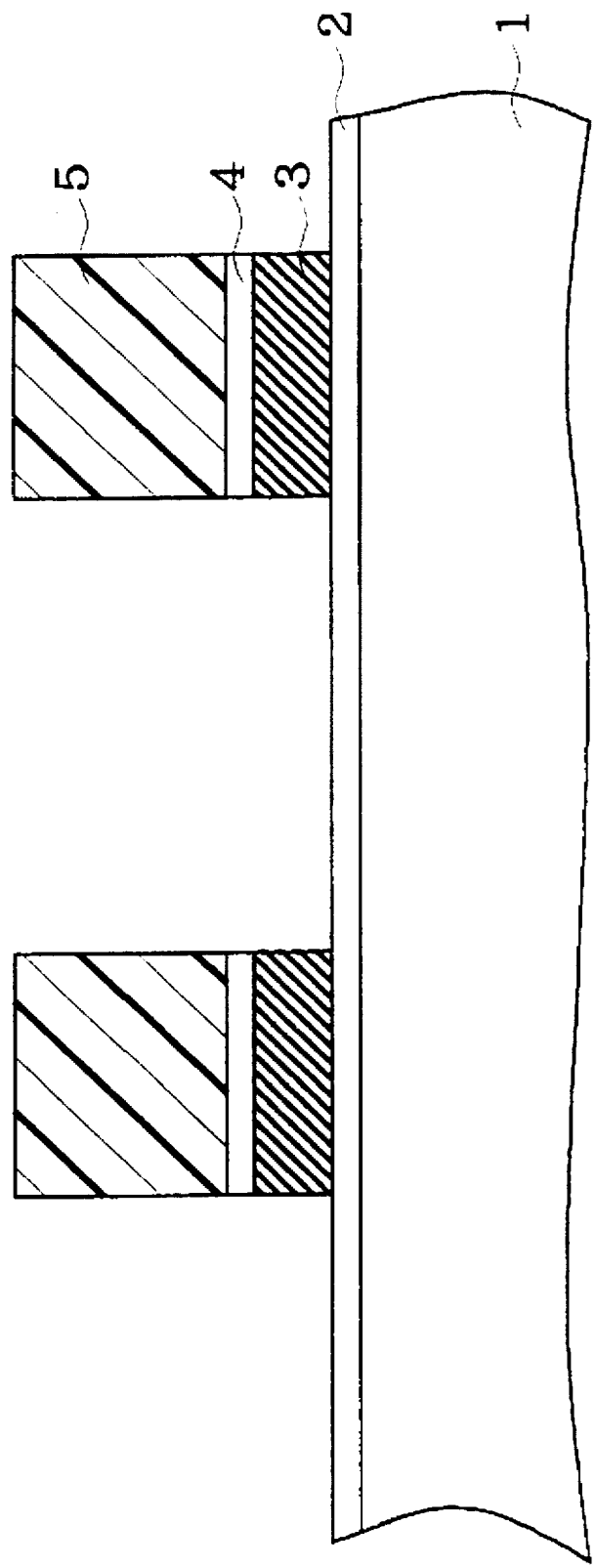
FIG. 3 is a sectional view explaining the first preferred embodiment of a manufacturing method of semiconductor device according to the present invention.

At a next step shown in FIG. 3, after forming a resist layer 5 by applying a chemically amplified resist over the entire surface of the thermal oxide film 4, the thermal oxide film 4 and silicon nitride film 3 are patterned by using the resist layer 5 as mask.

Figure 4:
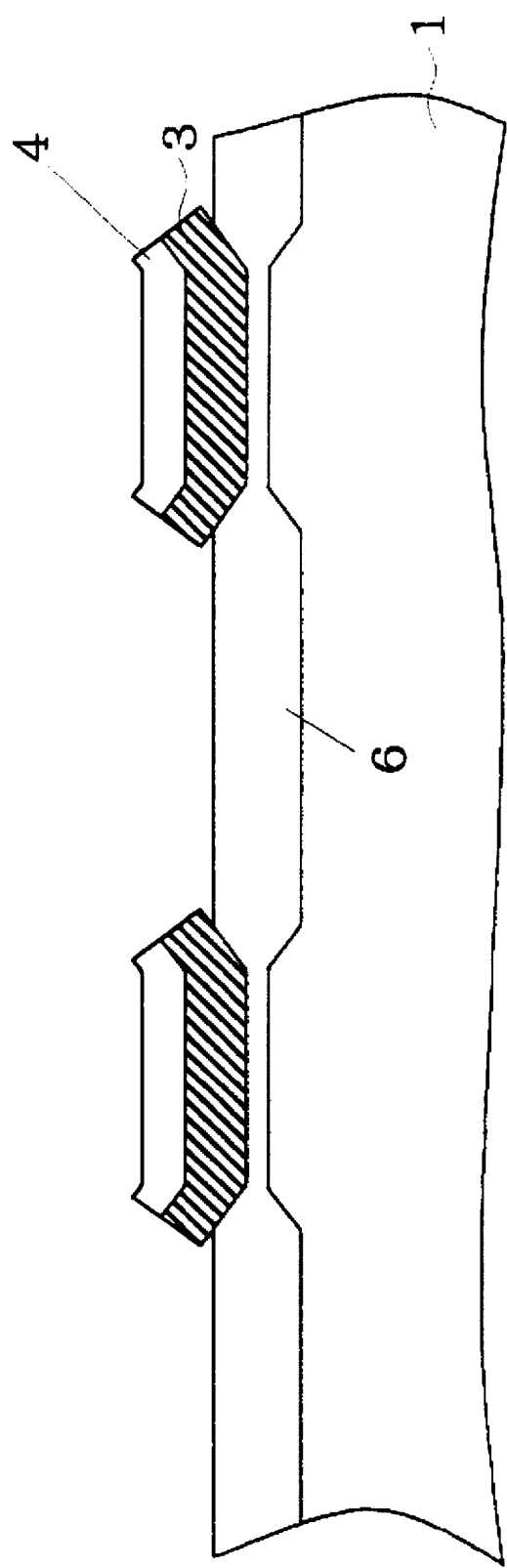
FIG. 4 is a sectional view explaining the first preferred embodiment of a manufacturing method of semiconductor device according to the present invention.

At a next step in FIG. 4, after removing the resist layer 5, thermal oxidation is performed in an oxygen atmosphere at 800° to 1200° C., and a field oxide film 6 is formed. At this time, the silicon nitride film 3 is further oxidized, and the thickness of the thermal oxidation film 4 is further increased.

Figure 5:
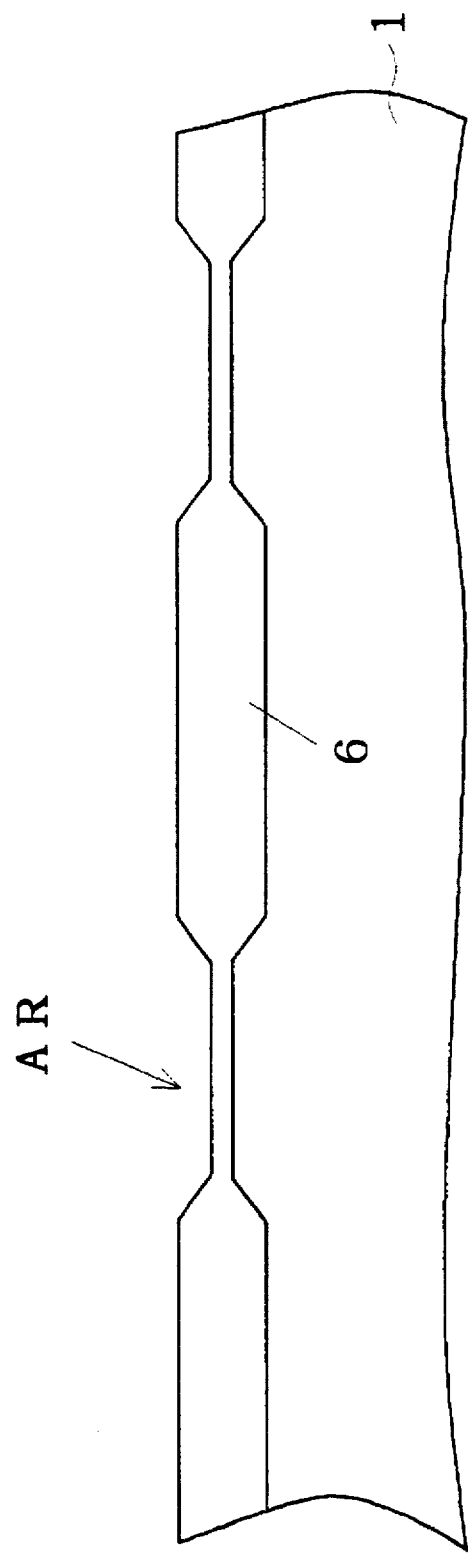
FIG. 5 is a sectional view explaining the first preferred embodiment of a manufacturing method of semiconductor device according to the present invention.

Finally, at a step shown in FIG. 5, by removing the thermal oxide film 4 and silicon nitride film 3, a structure having an active region AR surrounded by the field oxide film 6 (LOCOS structure) is obtained. At this time, the oxide film 2 is removed.

Herein, the thickness of the thermal oxide film 4 is defined about 40 to 50 angstroms (4 to 5 nm) because it is a sufficient thickness for isolating the silicon nitride film 3 and resist layer 5, and when patterning the thermal oxide film 54 and silicon nitride film 3, using the resist layer 5 as mask, the thermal oxide film 4 is too thick to be ignored for the thickness of the silicon nitride film 3, that is, for example, if the thickness of the silicon nitride film 3 is about half, the thermal oxide film 4 and silicon nitride film 3 cannot be etched simultaneously, and after removing the thermal oxide film 4, the silicon nitride film 3 is etched in a separate step, which makes the manufacturing process complicated. To the contrary, if the acid deactivation phenomenon of the resist layer 5 can be prevented, the thickness may be smaller.

Incidentally it is the thermal oxidation method only that can form an oxide film in a thickness of 40 to 50 angstroms on the silicon nitride film 3, and the CVD method is low in controllability and cannot form an oxide film of such thickness.

As described herein, according to the manufacturing method of semiconductor device of the invention, after forming a thermal oxide film 4 on the silicon nitride film 3, the resist layer 5 is formed by chemically amplified resist. The thermal oxide film 4 does not possess electron loan pair in its chemical structure, and hence has no property for taking in acid, that is, proton ($H^+$), and therefore it can prevent deactivation phenomenon of acid of the chemically amplified resist. Besides, the oxide film formed by thermal oxidation has a dense structure as compared with the oxide film formed by CVD method, and its surface is smooth. Therefore, water is not accumulated on the surface, and occurrence of deactivation phenomenon of acid of the chemically amplified resist by the water accumulated on the surface can be prevented.

It hence eliminates the problems of instability of dimensions and shape of the silicon nitride film due to tail (in the case of positive resist) or under-cut (in the case of negative resist) of the sectional shape of the resist layer 5. It also solves the problem of instability of the resist pattern by peeling of the resist layer, in the case of negative resist, due to deterioration of adhesion of the resist layer 5 and silicon nitride film 3.

<Second preferred embodiment>
<In the case of removing silicon nitride film after using as reflection preventive film>

When using KrF excimer laser light of wavelength of 248 nm as exposure light, the reflectivity increases between the silicon layer or high melting metal silicide layer and the resist. In the exposure by the KrF excimer laser light of wavelength of 248 nm, the chemically amplified resist is used as mentioned above, but when using a chemically amplified resist of high sensitivity, the problem is that the resist pattern is deformed by the exposure light reflected in the lateral direction at the step part or the like, and it has been attempted to form a reflection preventive film between the top surface of the resist layer or the resist layer and the etching layer.

As a second preferred embodiment of the manufacturing method of semiconductor device of the present invention, an example of using a silicon nitride film having a reflection preventive function as a foundation layer of the chemically amplified resist, and removing later the silicon nitride film is described below. FIG. 6 to FIG. 11 are sectional views sequentially showing the process of forming a MOS field effect transistor (hereinafter called MOSFET) in an active region surrounded by a field oxide film.

Figure 6:
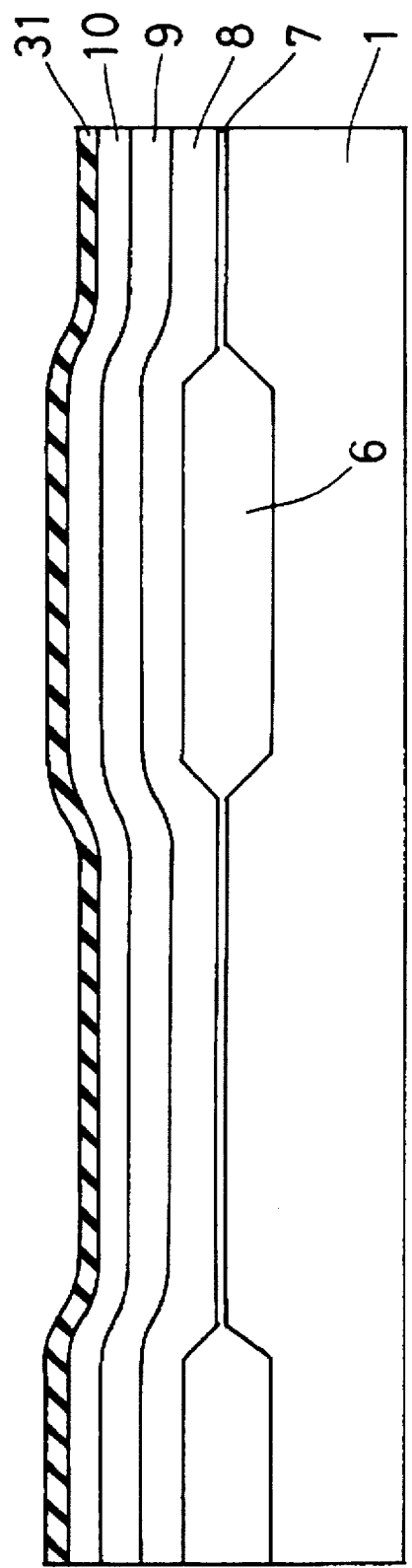
FIG. 6 is a sectional view explaining a second preferred embodiment of a manufacturing method of semiconductor device according to the present invention.

At a step shown in FIG. 6, first, a gate insulation film 7 is formed on the surface of a silicon substrate 1 in a thickness of 5 to 30 cm by thermal oxidation method. Successively, a first polycrystal silicon film 8 doped with phosphorus or arsenic is formed in a thickness of 50 to 200 nm by CVD method. Then, by sputtering method, a first high melting metal silicide film 9 of tungsten silicide or the like is formed in a thickness of 50 to 300 nm.

Consequently, on this first high melting metal silicide film 9, a silicon oxide film 10 is formed in a thickness of 50 to 300 nm by CVD method. Later, in the silicon oxide film 10, a plasma silicon nitride film 31 is formed in a thickness of about 20 nm by plasma enhanced chemical vapor deposition (plasma CVD) method. Herein, the plasma silicon nitride film 31 is a silicon nitride film containing more silicon than stoichiometric silicon nitride (Si3N4), and functions as reflection preventive film. The plasma CVD method is a kind of CVD method for obtaining the excitation energy of gas as the material of the silicon nitride film by plasma.

The forming method of the plasma silicon nitride film is described below. This plasma silicon nitride film is formed by exciting plasma in an atmosphere of monosilane gas, ammonia gas and nitrogen gas, and forming a mixed film of Si, N, and H atoms. Therefore, the molecular formula of the mixed film is $Si_xNy:H$, where x and y are mixing ratios, and x/y ranges from 3/4 to infinity. Atoms of H are bonded with unbonded seed of Si. For example, in the case of x/y=3/4, it is a stoichiometric nitride film ($Si_3N_4$). Or, when x/y is infinite, it is Si only, and it is an amorphous silicon.

By varying the flow rate ratio of the monosilane gas supplying Si atoms, ammonia gas supplying N atoms, and $N_2$ gas, a plasma silicon nitride film containing more silicon than stoichiometric nitride film ($Si_3N_4$) can be formed. As a result, the complex refractive index of plasma silicon nitride film (n−i×k; i is an imaginary number) can be taken as an intermediate value from the stoichiometric nitride film (2.27−0×i) to amorphous silicon (1.9−3.4×i), where n is a real part indicating the so-called refractive index for determining the light velocity in the substance, and k denotes an imaginary part corresponding to the absorption coefficient of light.

The plasma silicon nitride film 31 in this embodiment is formed in the conditions of flow rate of monosilane gas, ammonia gas, and nitrogen gas of 150 sccm, 50 sccm, and 1000 sccm, respectively, forming temperature of about 400° C., forming pressure of 4 Torr, and high frequency charge electric power of 240 W, so as to function as reflection preventive film against the exposure light of wavelength of 248 nm, and the complex refractive index to the exposure light of wavelength of 248 nm is designed to be 2.2 in the real part n, and 1.0 in the imaginary part k. Or, as far as the real part n is in a range of above 1.8 under 3.4, and the imaginary part k is above 0.5 under 2.0, the reflectivity is under 30% to the exposure light of wavelength of 248 nm and wavelength of 365 nm, and hence the function as reflection preventive film is presented.

Figure 7:
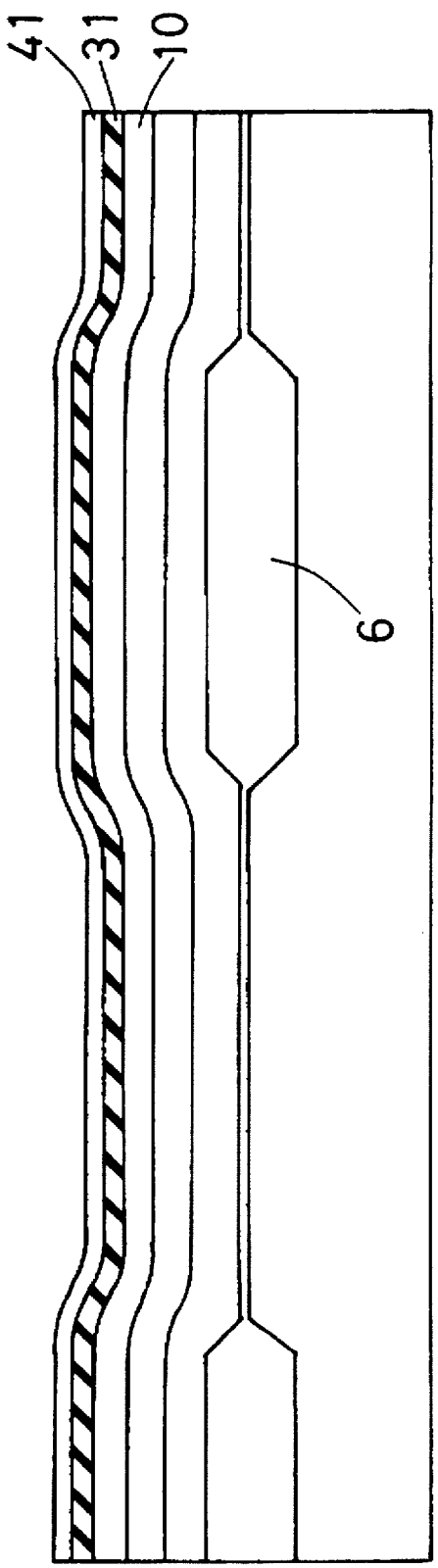
FIG. 7 is a sectional view explaining the second preferred embodiment of a manufacturing method of semiconductor device according to the present invention.

Next, at a step shown in FIG. 7, exposing the plasma silicon nitride film 31 to an oxygen plasma, a thermal oxide film 41 is formed in a thickness of about 40 to 50 angstroms (4 to 5 nm) over the entire surface of the plasma silicon nitride film 31. The thermal oxide film 41 with film thickness of 40 to 50 angstroms (4 to 5 nm) has a film thickness of about one quarter of the plasma silicon nitride film 31 with the film thickness of about 20 nm, and hence it does not interfere in the subsequent process of continuous etching of the thermal oxide film 41 and plasma silicon nitride film 31. Besides, since the thermal oxide film 41 is so thin, it does not interfere the reflection preventive function of the plasma silicon nitride film 31. Herein, the oxygen plasma can be generated by using the plasma CVD apparatus used in formation of the plasma silicon nitride film 31, so that the manufacturing process is simplified.

Figure 8:
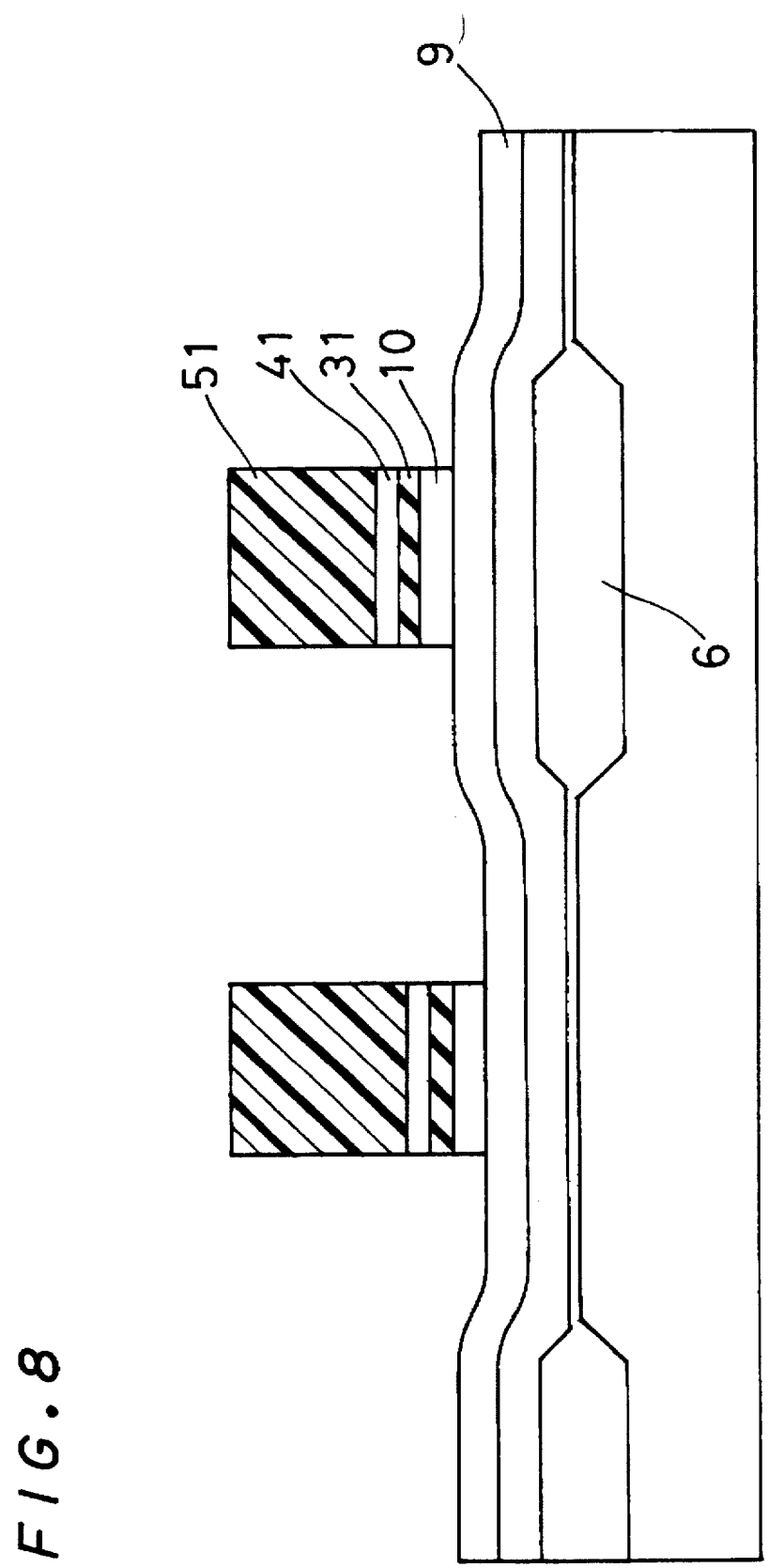
FIG. 8 is a sectional view explaining the second preferred embodiment of a manufacturing method of semiconductor device according to the present invention.

At a next step in FIG. 8, a chemically amplified resist is applied over the entire surface of the thermal oxide film 41 in a thickness of about 700 to 1000 nm, and a resist layer 51 having a predetermined pattern is formed by exposure. Using the resist layer 51 as mask, the thermal oxide film 41, plasma silicon nitride film 31, and silicon oxide film 10 are continuously and selectively etched by RIE (reactive ion etching) method.

Figure 9:
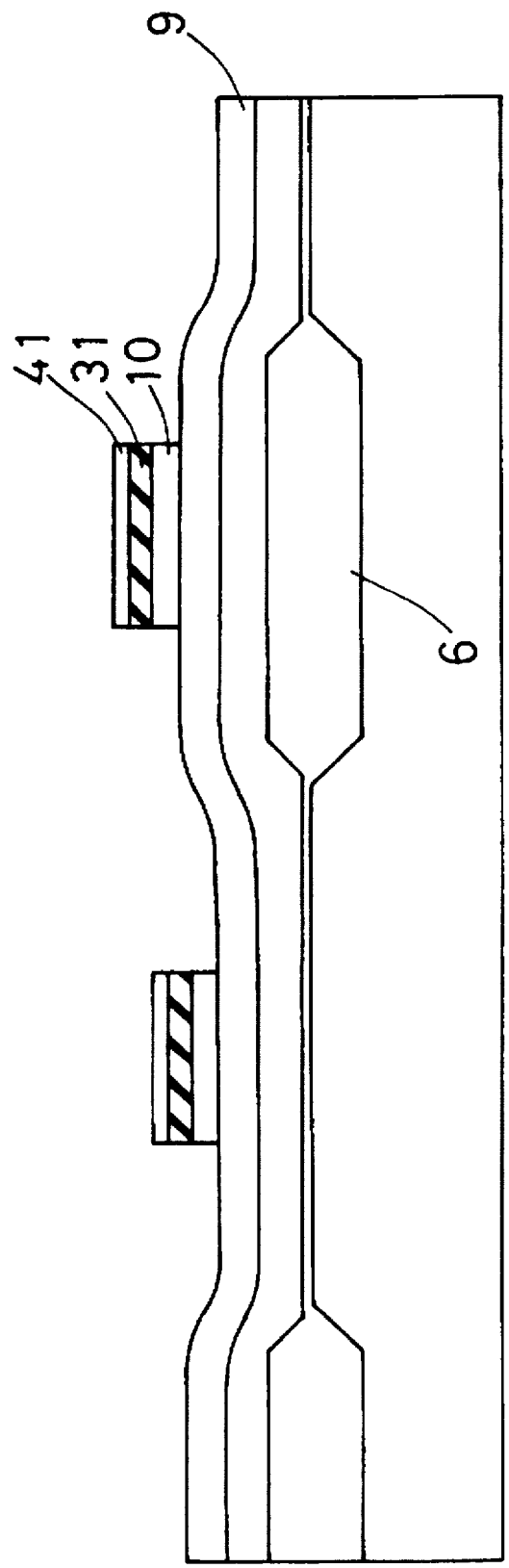
FIG. 9 is a sectional view explaining the second preferred embodiment of a manufacturing method of semiconductor device according to the present invention.

At a next step in FIG. 9, the resist layer 51 is removed.

Figure 10:
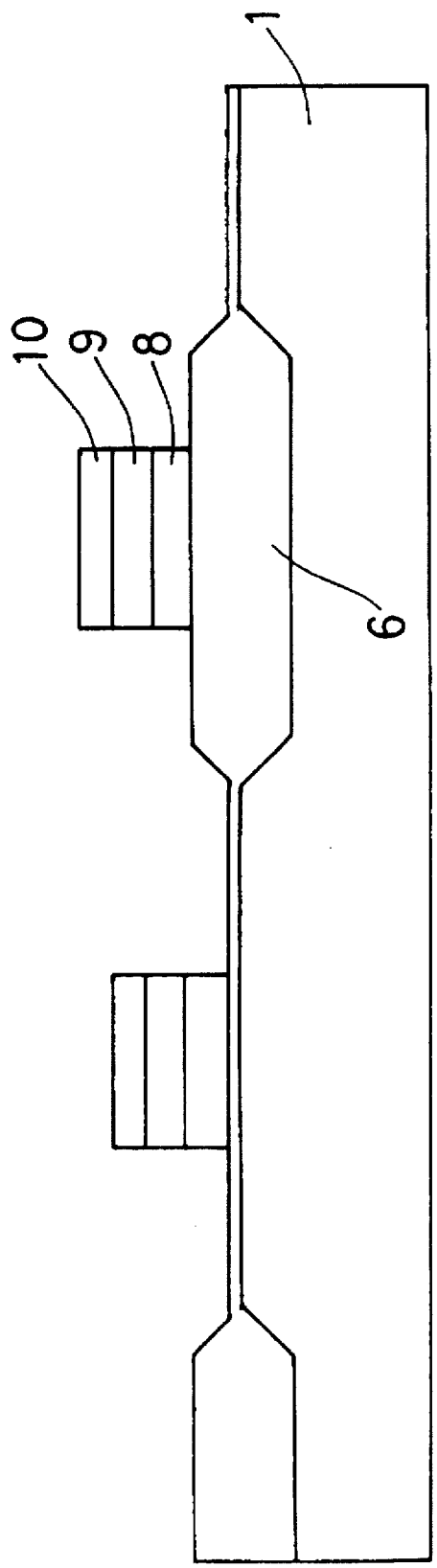
FIG. 10 is a sectional view explaining the second preferred embodiment of a manufacturing method of semiconductor device according to the present invention.

At a next step in FIG. 10, using the thermal oxide film 41, plasma silicon nitride film 31, and silicon oxide film 10 as mask, a first high melting metal silicide film 9 and a first polycrystal silicon film 8 are continuously and selectively removed by the RIE method.

The plasma silicon nitride film 31 as reflection preventive film has an etching rate similar to that of the silicon oxide film in etching by RIE method. By contrast, it has a selective ratio of about 3 to 10 to tungsten silicide or polysilicon. Therefore, etching can be done easily by the RIE method by using etching gas such as carbon tetrafluoride used in etching of silicon oxide film, and chlorine used in etching of polysilicon.

Figure 11:
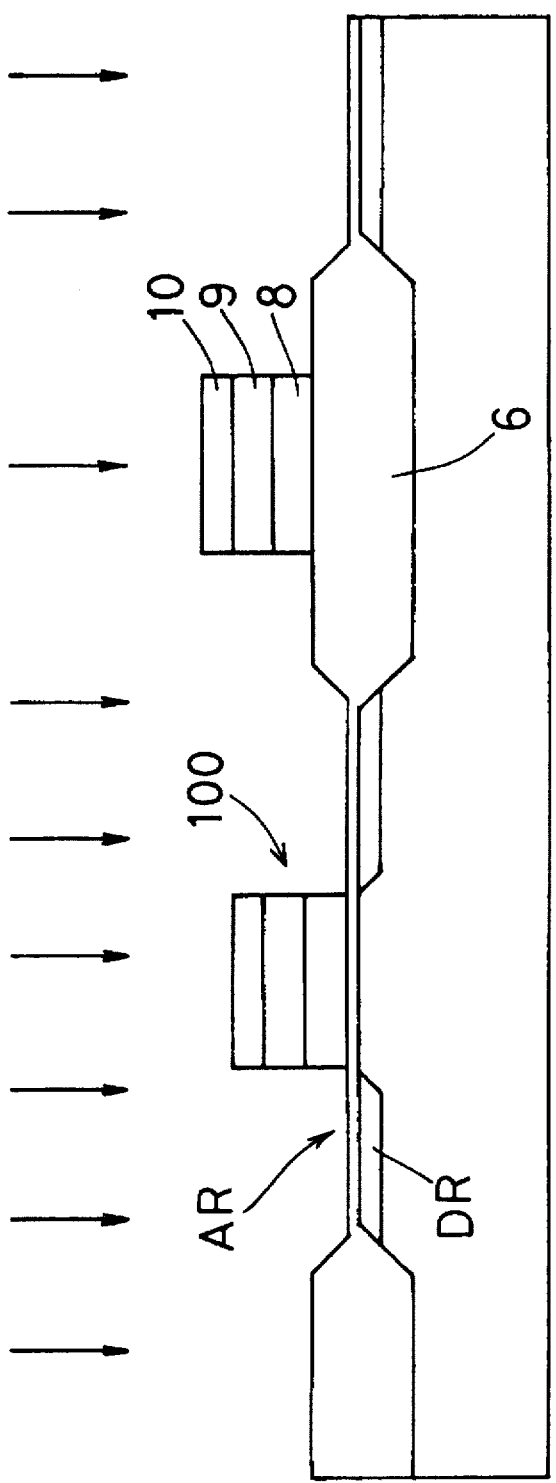
FIG. 11 is a sectional view explaining the second preferred embodiment of a manufacturing method of semiconductor device according to the present invention.

Consequently, at a step shown in FIG. 11, using the silicon oxide film 10, first high melting metal silicide film 9, and first polycrystal silicon film 8 as mask, impurities such as phosphorus and boron injected into the surface of the silicon substrate 1 by ion implantation method, and an impurity diffusion region DR is formed, and hence a MOSFET 100 is formed in an active region AR surrounded by the field oxide film 6, and the first polycrystal silicon film 8, first high melting metal silicide film 9, and silicon oxide film 10 are sequentially laminated on the field oxide film 6.

As described herein, according to the manufacturing method of semiconductor device of the invention, after forming the thermal oxide film 41 on the plasma silicon nitride film 31 as reflection preventive film, the resist layer 51 by chemically amplified resist is formed. The thermal oxide film 41 does not possess electron loan pair in its chemical structure, and hence has no property for taking in acid, that is, proton ($H^+$), and therefore it can prevent deactivation phenomenon of acid of the chemically amplified resist. Besides, the oxide film formed by thermal oxidation has a dense structure as compared with the oxide film formed by CVD method, and its surface is smooth. Therefore, water is not accumulated on the surface, and occurrence of deactivation phenomenon of acid of the chemically amplified resist by the water accumulated on the surface can be prevented. Therefore, it eliminates the problems of instability of dimensions and shape of the plasma silicon nitride film 31 and silicon oxide film 10 due to tail (in the case of positive resist) or under-cut (in the case of negative resist) of the sectional shape of the resist layer 51. It also solves the problem of instability of the resist pattern by peeling of the resist layer 51, in the case of negative resist, due to deterioration of adhesion of the resist layer 51 and plasma silicon nitride film 31.

<Third preferred embodiment>

<If not removing the silicon nitride film after using as reflection preventive film>

A third preferred embodiment of the manufacturing method of semiconductor device of the invention is an example of using a silicon nitride film having reflection preventive function as a foundation layer of chemically amplified resist, and leaving the silicon nitride film. FIG. 12 to FIG. 15 are sectional views showing sequentially the process after the forming step of the MOSFET shown in FIG. 6 to FIG. 11 as the second preferred embodiment.

Figure 12:
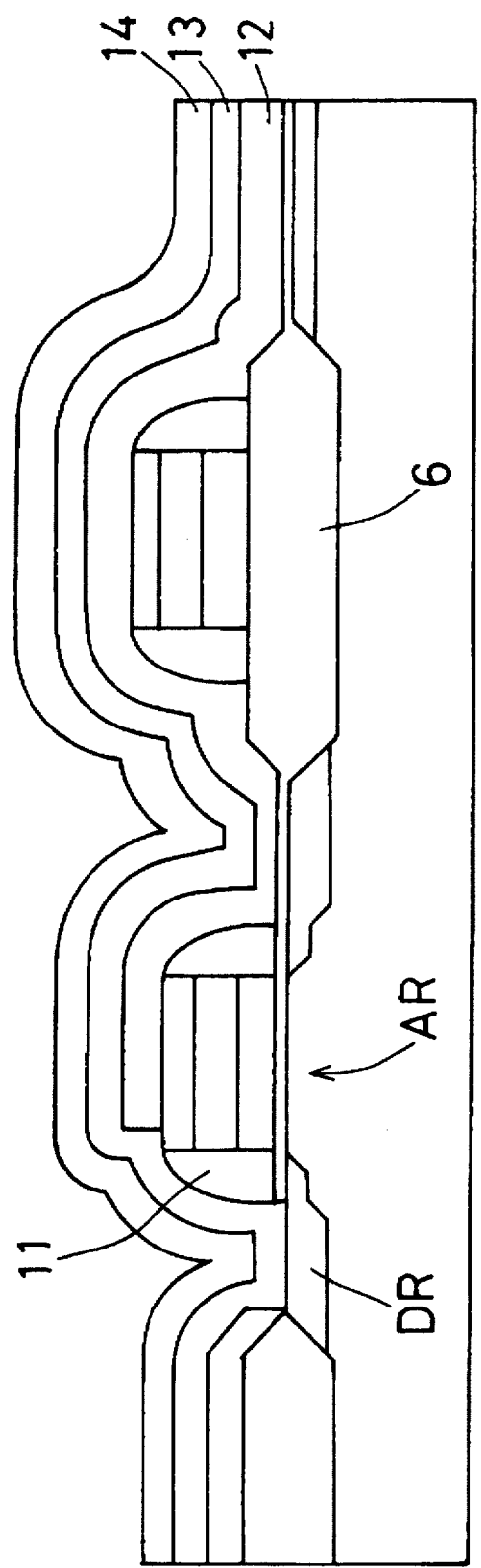
FIG. 12 is a sectional view explaining a third preferred embodiment of a manufacturing method of semiconductor device according to the present invention.

In FIG. 12, a laminated member formed in an active region AR surrounded by a field oxide film 6, and a laminated member formed on the field oxide film 6 respectively have a side wall insulating film 11 at each side wall, and a silicon oxide film 12 is formed from above the laminated member formed in the active region AR to above the laminated member formed on the field oxide film 6. Herein, the upper part of the laminated member formed in the active region AR is not completely covered with silicon oxide film 12. Over the entire surface, moreover, a second polycrystal silicon film 13 and a second high melting metal silicide film 14 are formed. An impurity diffusion region DR has a double diffusion structure by further injecting impurities using the side wall insulating film 11 as mask. The second polycrystal silicon film 13 and second high melting metal silicide film 14 are formed of the same material and in the same conditions as the first polycrystal silicon film 8 and first high melting metal silicide film 9. The process for obtaining such constitution is a prior art, and is not closely related with the invention, and detailed description is omitted.

Figure 13:
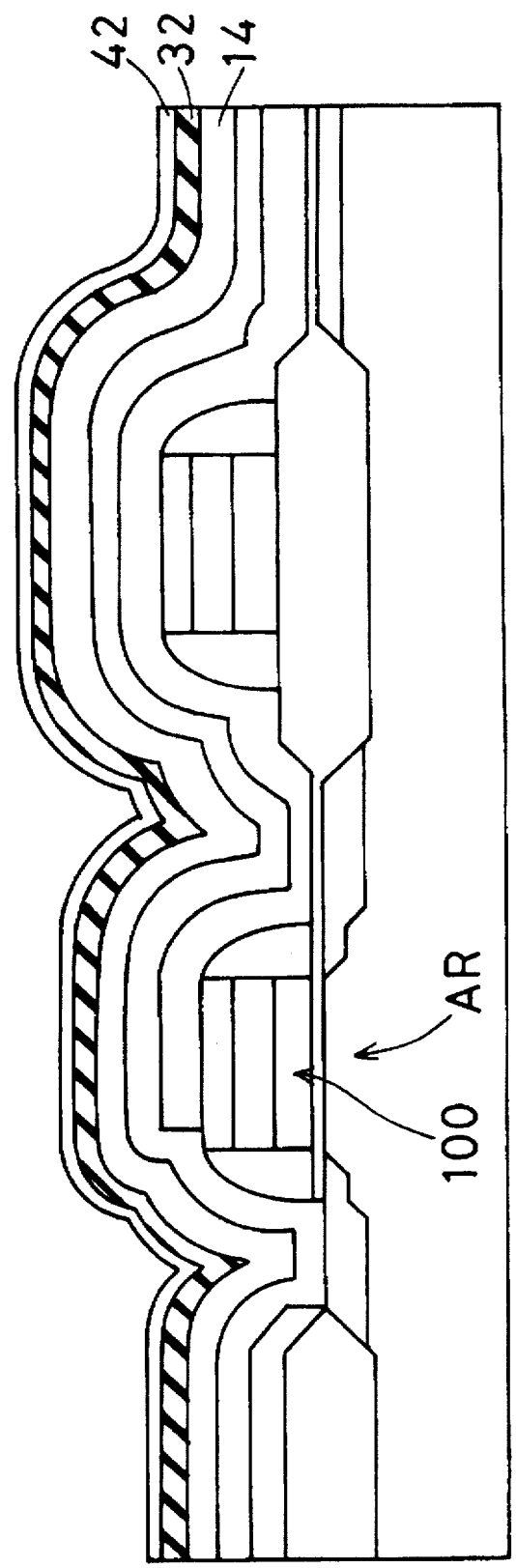
FIG. 13 is a sectional view explaining the third preferred embodiment of a manufacturing method of semiconductor device according to the present invention.

Consequently, at a step in FIG. 13, after forming a plasma silicon nitride film 32 as reflection preventive film in the same condition as in the plasma silicon nitride film 31 in the second preferred embodiment described in FIG. 7, on the second high melting metal silicide film 14, the plasma silicon nitride film 32 is exposed to an oxygen plasma, and a thermal oxide film 42 is formed on the entire surface of the plasma silicon nitride film 32 in a thickness of 40 to 50 angstroms (4 to 5 nm). Since the thermal oxide film 42 is so thin, it does not interfere the reflection preventive function of the plasma silicon nitride film 31. Herein, by using the plasma CVD apparatus used in forming the plasma silicon nitride film 32, oxygen plasma is generated to expose the plasma silicon nitride film 32 to the oxygen plasma.

Figure 14:
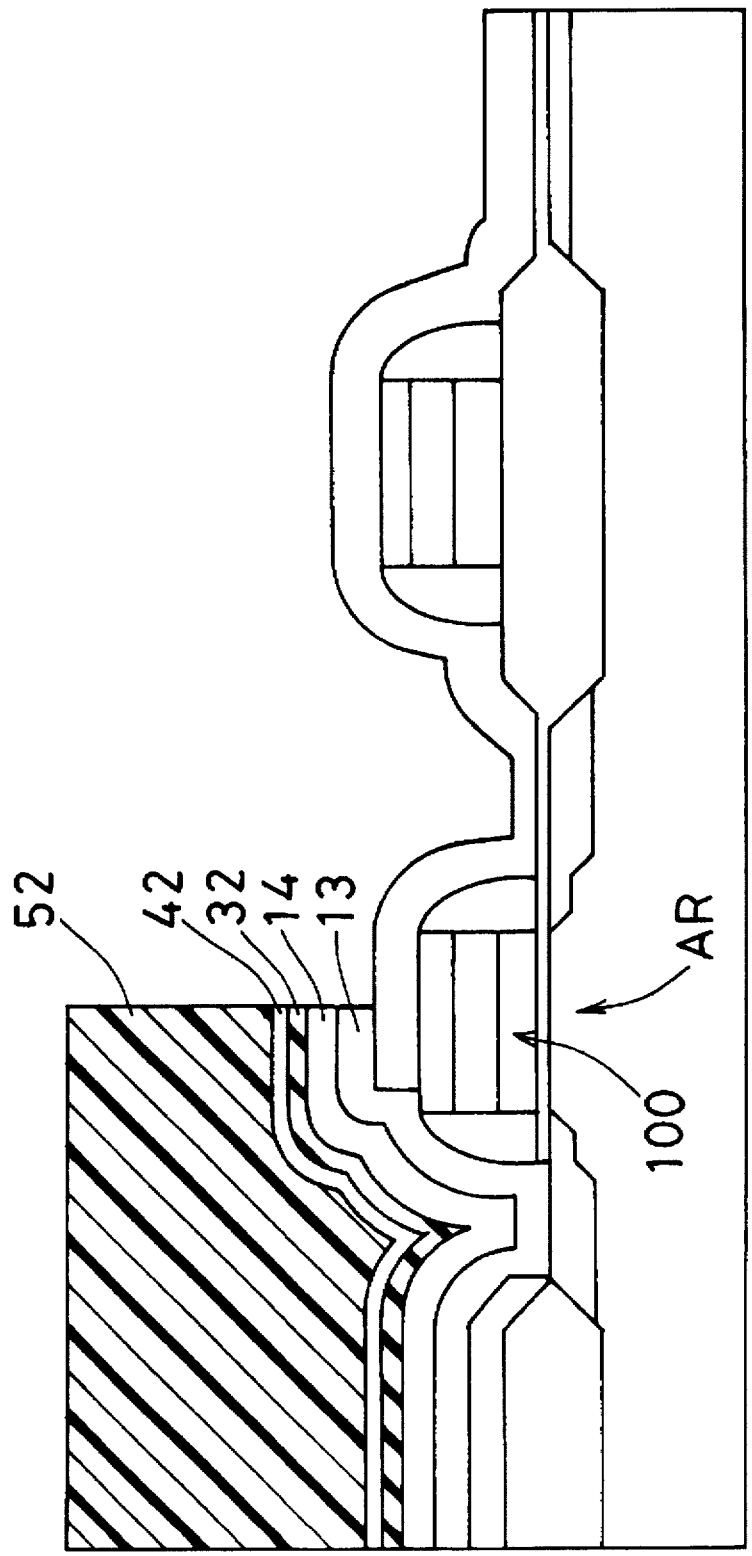
FIG. 14 is a sectional view explaining the third preferred embodiment of a manufacturing method of semiconductor device according to the present invention.

At a next step in FIG. 14, by applying a chemically amplified resist over the entire surface of the thermal oxide film 42 and exposing, a resist layer 52 having a predetermined pattern is formed. Next, using the resist layer 52 as mask, the plasma silicon nitride film 32, second high melting metal silicide film 14, and second polycrystal silicon film 13 are continuously and selectively etched by the RIE method.

Figure 15:
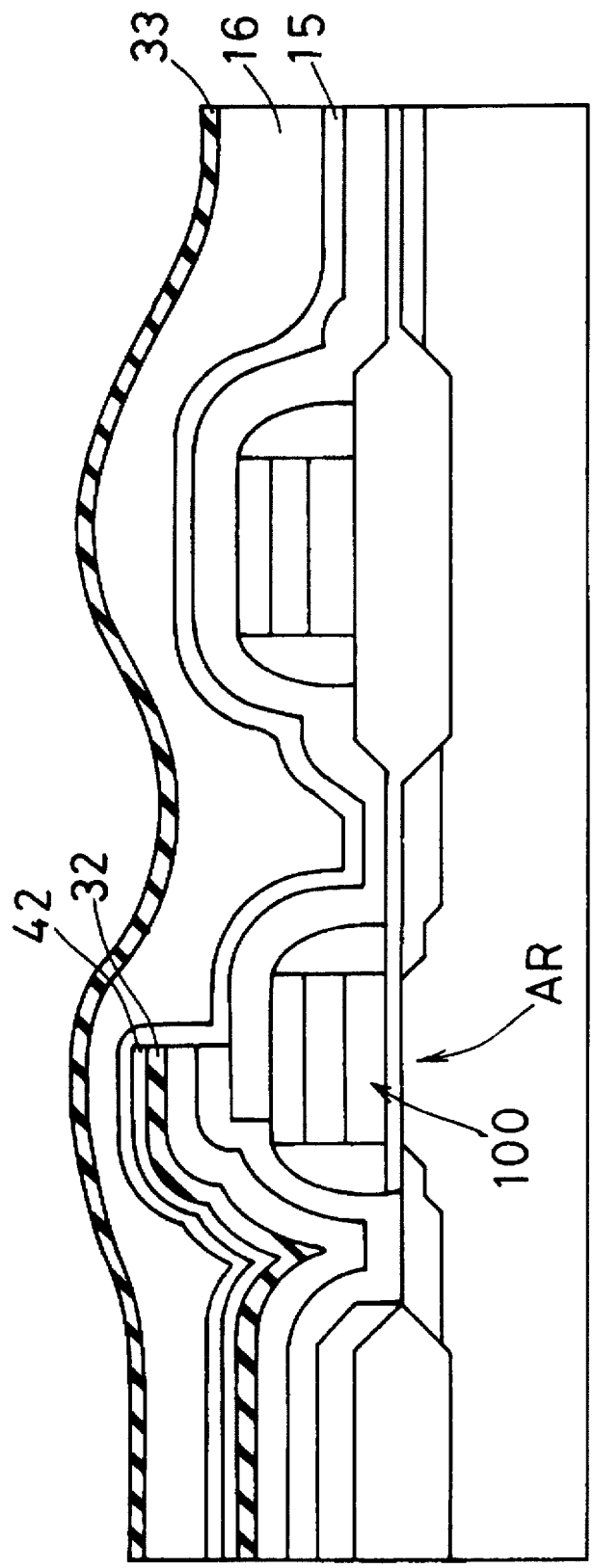
FIG. 15 is a sectional view explaining the third preferred embodiment of a manufacturing method of semiconductor device according to the present invention.
Figure 16:
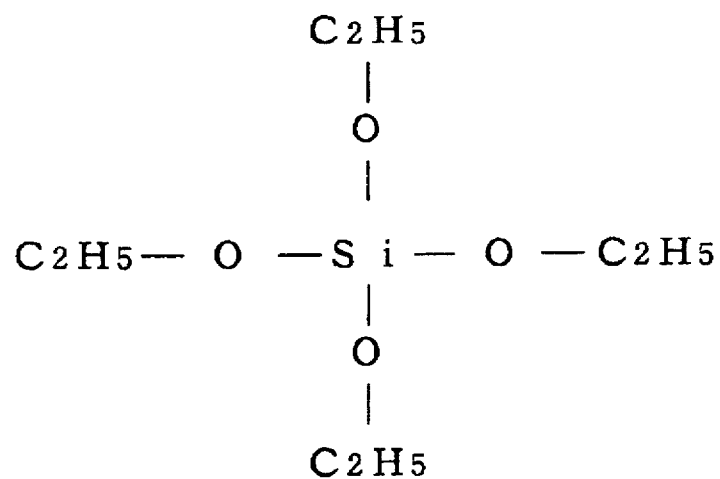
FIG. 16 is a diagram showing a structural formula of source gas of TEOS.
Figure 17:
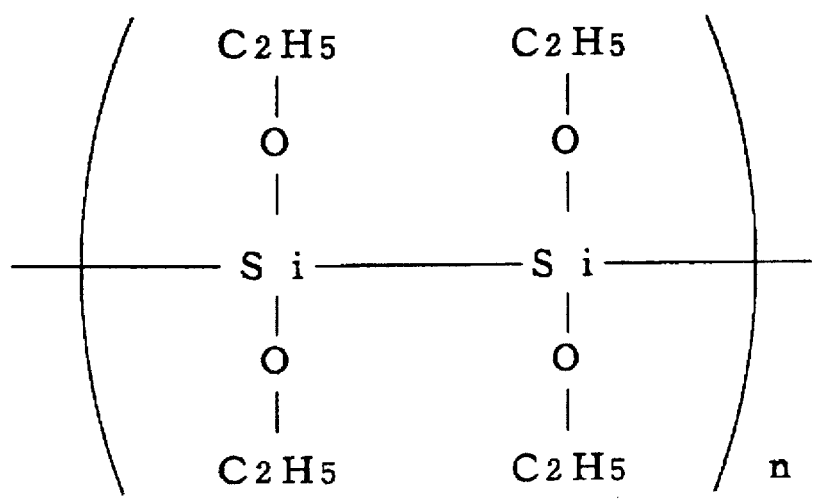
FIG. 17 is a diagram showing a structural formula of an ideal TEOS film.
Figure 18:
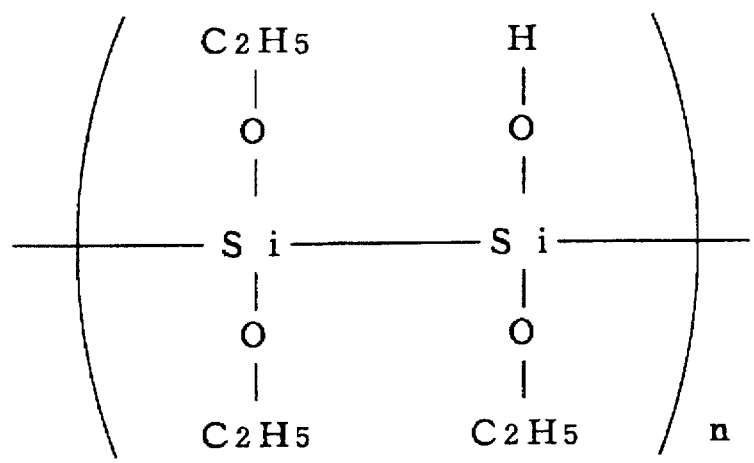
FIG. 18 is a diagram showing a structural formula of an actually formed TEOS film.
Figure 19:
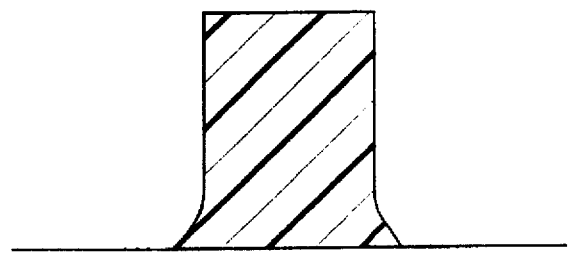
FIG. 19 is a sectional view of a resist having a tail.
Figure 20:
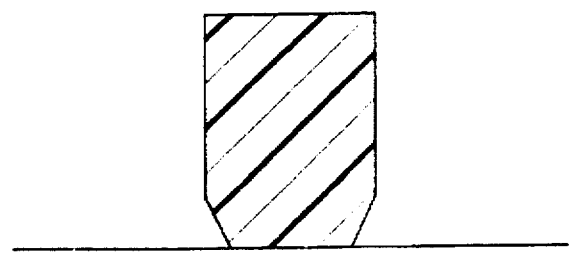
FIG. 20 is a sectional view of a resist having an under-cut.
Figures 21A, 21B:
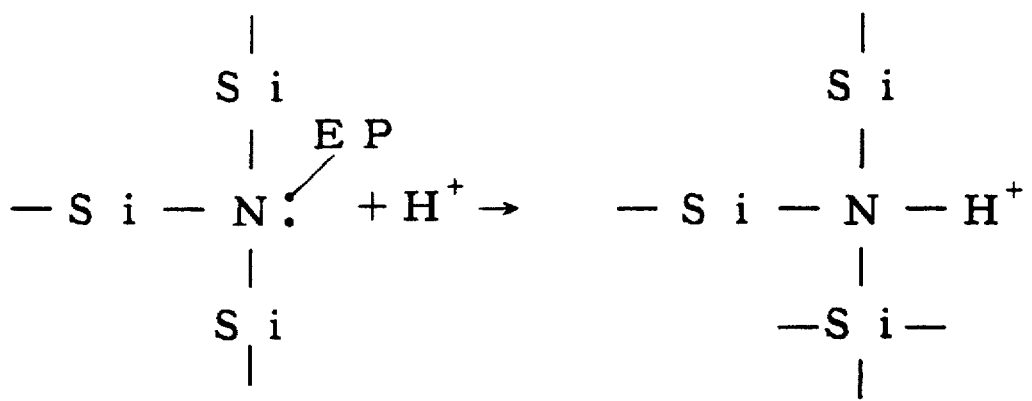
FIG. 21 is a diagram showing a chemical reaction for taking in a proton by a silicon nitride film.

At a next step in FIG. 15, after forming a silicon oxide film 15 over the entire surface, a BPSG (boro-phospho silicate glass) film is formed on the entire surface, and by heating, an interlayer insulating film 16 with a flattened surface is completed. Later, on the surface of the interlayer insulating film 16, a plasma silicon nitride film 33 is formed as reflection preventive film in the same condition as in the plasma silicon nitride film 31 in the second preferred embodiment described in FIG. 7.

Meanwhile, as shown in FIG. 15, the plasma silicon nitride film 32 and thermal oxide film 42 are left over above the active region AR, but the plasma silicon nitride film 32 does not interfere the operation of the semiconductor device and hence may not be removed. Besides, the thermal oxide film 42 is sufficiently thin, and the interlayer insulating film 16 is formed thereon, and hence the thermal oxide film 42 does not pose any problem.

In a later step, a thermal oxide film is formed on the plasma silicon nitride film 33, and a chemically amplified resist is applied thereon, and etching in specified pattern is made, and in both action and effect, it is same as when the thermal oxide film 42 is formed on the plasma silicon nitride film 32, and detailed description is omitted.

As described herein, according to the manufacturing method of semiconductor device of the invention, after forming the thermal oxide film 42 on the plasma silicon nitride film 32 as reflection preventive film, the resist layer 52 by chemically amplified resist is formed. The thermal oxide film 42 does not possess electron loan pair in its chemical structure, and hence has no property for taking in acid, that is, proton (H+), and therefore it can prevent deactivation phenomenon of acid of the chemically amplified resist. Besides, the oxide film formed by thermal oxidation has a dense structure as compared with the oxide film formed by CVD method, and its surface is smooth. Therefore, water is not accumulated on the surface, and occurrence of deactivation phenomenon of acid of the chemically amplified resist by the water accumulated on the surface can be prevented. Therefore, it eliminates the problems of instability of dimensions and shape of the plasma silicon nitride film 32, second high melting metal silicide film 14, and second polycrystal silicon film 13 due to tail (in the case of positive resist) or under-cut (in the case of negative resist) of the sectional shape of the resist layer 52. It also solves the problem of instability of the resist pattern by peeling of the resist layer 52, in the case of negative resist, due to deterioration of adhesion of the resist layer 52 and plasma silicon nitride film 32.

<Fourth preferred embodiment>

In the first preferred embodiment of the manufacturing method of semiconductor device of the invention, the stoichiometric silicon nitride film (Si3N4) 3 is formed by the CVD method, and the thermal oxide film 4 is formed thereon, but instead of the stoichiometric silicon nitride film 3, a plasma silicon nitride film containing more silicon than the stoichiometric silicon nitride 3 described in the second and third preferred embodiments may be formed. The plasma silicon nitride film functions as reflection preventive film, and hence it is possible to prevent deformation of resist pattern by reflection of exposure light.

<Fifth preferred embodiment>

In the first to third preferred embodiments of the manufacturing method of semiconductor device of the invention described herein, it is shown to prevent deactivation phenomenon of acid of the chemically amplified resist by forming a thermal oxide film on the stoichiometric silicon nitride film for forming field oxide film or plasma silicon nitride film as reflection preventive film, as far as the operation of the semiconductor device is not interfered, the deactivation phenomenon of acid of the chemically amplified resist may be prevented by forming a stoichiometric silicon nitride film or plasma silicon nitride film for the purpose of preventing deactivation phenomenon of acid of the chemically amplified resist only, and forming a thermal oxide film thereon.

<Sixth preferred embodiment>

In the first to fourth preferred embodiments of the manufacturing method of semiconductor device of the invention described herein, the chemically amplified resist is applied after thermally oxidizing the silicon nitride film and forming a thin thermal oxide film. However, not limited to the silicon nitride film, as far as the material can form a thermal oxide film, by applying a chemically amplified resist after forming a thermal oxide film, deactivation phenomenon of acid of the chemically amplified resist can be prevented. For example, when the foundation layer is a polycrystal silicon, or a monocrystalline silicon, or a tungsten silicide, the thermal oxide film can be formed, and therefore by applying the chemically amplified resist after forming the thermal oxide film, the same action and effect can be obtained.

While the invention has been shown and described in detail, the foregoing description is in all aspects illustrative and not restrictive. It is therefore understood that numerous modifications and variations can be devised without departing from the scope of the invention.

I claim:

1. A method of manufacturing a semiconductor device for patterning by using a chemically amplified resist in which a reaction is promoted by an acid serving as a catalyst, said method comprising the steps of:

(a) forming a thermally oxidizable foundation layer including forming a silicon nitride film having a first (b) forming a thermal oxide film on said silicon nitride film by thermally oxidizing said foundation layer; and (c) applying said chemically amplified resist on said thermal oxide film and then forming a resist layer having a predetermined pattern by exposing said chemically amplified resist to light.

2. A manufacturing method of semiconductor device of claim 1, wherein said step (a) comprises the step of:

(d) forming a silicon nitride film by thermal chemical vapor deposition method, and said step (b) comprises the step of:

(e) thermally oxidizing a surface of said silicon nitride film by exposing said silicon nitride film to an oxygen atmosphere at 800° to 1200° C.

3. A manufacturing method of semiconductor device of claim 2, wherein said step (e) comprises the step of forming a thermal oxide film in a thickness of 40 to 50 angstroms, said method further comprising the step of:

(f) removing simultaneously said thermal oxide film and said silicon nitride film, by using said resist layer as mask, after said step (c).

4. A manufacturing method of semiconductor device of claim 1, wherein said step (a) comprises the step of:

(d) forming a plasma silicon nitride film containing more silicon than stoichiometric silicon nitride (Si3N4) by plasma chemical vapor deposition method, as said foundation layer, and said step (b) comprises the step of:

(e) thermally oxidizing a surface of said silicon nitride film by exposing said silicon nitride film to oxygen plasma.

5. A manufacturing method of semiconductor device of claim 4, wherein said step (e) comprises the step of forming a thermal oxide film in a thickness of 40 to 50 angstroms, said method further comprising the step of:

(f) removing simultaneously said thermal oxide film and said plasma silicon nitride film, by using said resist as mask, after said step (c).

6. A manufacturing method of semiconductor device of claim 4, wherein said step (d) comprises the step of:

forming a plasma silicon nitride film of which real part of complex refractive index to the wavelength of exposure light is above 1.8 under 3.4, and imaginary part is above 0.5 under 2.0, by controlling a supply flow rate of material gas of ammonia below a supply flow rate of material gas of monosilane, in a mixed atmosphere of material gas of monosilane, material gas of ammonia, and material gas of nitrogen.

* * * * *